(12) United States Patent
Haruta

(10) Patent No.: US 7,944,329 B2
(45) Date of Patent: May 17, 2011

(54) ACOUSTIC WAVE FILTER DEVICE WITH BRANCHED GROUND WIRING SANDWICHING THE IDT AREA

(75) Inventor: Kazumasa Haruta, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/773,110

(22) Filed: May 4, 2010

(65) Prior Publication Data

US 2010/0207708 A1    Aug. 19, 2010

Related U.S. Application Data

(63) Continuation of application No. PCT/JP2009/001027, filed on Mar. 6, 2009.

(30) Foreign Application Priority Data

Mar. 27, 2008  (JP) ................. 2008-083630

(51) Int. Cl.
*H03H 9/64* (2006.01)
(52) U.S. Cl. ............... 333/193; 333/195; 310/313 B
(58) Field of Classification Search .......... 333/193–196, 333/133; 310/313 B
See application file for complete search history.

(56) References Cited

U.S. PATENT DOCUMENTS

| 2004/0196119 A1 | 10/2004 | Shibahara et al. | |
|---|---|---|---|
| 2007/0018756 A1 | 1/2007 | Fujii et al. | |
| 2007/0103254 A1 | 5/2007 | Haruta et al. | |
| 2007/0290770 A1* | 12/2007 | Otsuka et al. | 333/193 |

FOREIGN PATENT DOCUMENTS

| JP | 2003-124782 A | | 4/2003 |
|---|---|---|---|
| JP | 2004-235908 A | | 8/2004 |
| JP | 2004-282707 A | | 10/2004 |
| JP | 3918102 B2 | | 5/2007 |
| JP | 2007-142491 A | | 6/2007 |
| JP | 2007-259430 A | | 10/2007 |
| JP | 2008-28825 | * | 2/2008 |
| WO | 2006/003787 A1 | | 1/2006 |
| WO | 2006/009021 A1 | | 1/2006 |
| WO | WO 2008/038498 | * | 4/2008 |

OTHER PUBLICATIONS

Official Communication issued in International Patent Application No. PCT/JP2009/001027, mailed on Jun. 2, 2009.

* cited by examiner

*Primary Examiner* — Barbara Summons
(74) *Attorney, Agent, or Firm* — Keating & Bennett, LLP

(57) ABSTRACT

An acoustic wave filter device has a balance-unbalance conversion function and has an increased out-of-band attenuation. The acoustic wave filter device includes a 5-IDT-type longitudinally coupled resonator-type acoustic wave filter unit including IDTs that are connected between an unbalanced terminal and first and second balanced terminals, and the IDTs and are connected to the first and second balanced terminals, respectively, that is arranged between the unbalanced terminal and the first and second balanced terminals. A second ground wiring that connects the end portions of the unbalanced-side IDT on the side connected to the ground potential to a ground terminal is separated from a first ground wiring. The second ground wiring includes first and second branched wiring portions, and the first and second branched wiring portions are arranged so as to sandwich an area in which the IDTs are provided.

5 Claims, 13 Drawing Sheets

ACOUSTIC WAVE FILTER DEVICE WITH BRANCHED GROUND WIRING SANDWICHING THE IDT AREA

BACKGROUND OF THE INVENTION

1. Field of the Invention

The present invention relates to an acoustic wave filter device including a longitudinally coupled resonator-type acoustic wave filter unit, in which at least three IDTs are provided on a piezoelectric substrate. More particularly, the present invention relates to a longitudinally coupled resonator-type acoustic wave filter device having a balance-unbalance conversion function.

2. Description of the Related Art

Surface acoustic wave filter devices having a balance-unbalance conversion function have been used in band filters of mobile phones, and other devices. Furthermore, in recent years, in place of surface acoustic wave filter devices using a surface acoustic wave, boundary acoustic wave filter devices using a boundary acoustic wave have attracted attention. When acoustic wave filter devices, such as surface acoustic wave filter devices or boundary acoustic wave filter devices, have a balance-unbalance conversion function, a separate balance-unbalance conversion function element called a balun can be omitted. As a result, it is possible to reduce the number of parts, and it is possible to decrease the size of mobile phones.

In Japanese Unexamined Patent Application Publication No. 2003-124782 described below, a surface acoustic wave filter device having a balance-unbalance conversion function is disclosed. As shown in FIG. 19, in a surface acoustic wave filter device 1001 disclosed in Japanese Unexamined Patent Application Publication No. 2003-124782, a surface acoustic wave filter element chip 1003 is housed in a package 1002 having an upward facing opening 1002a. In the surface acoustic wave filter element chip 1003, on a piezoelectric substrate 1004, an electrode configuration shown in FIG. 19 is provided, and a surface acoustic wave filter having a balance-unbalance conversion function is provided.

That is, a 3-IDT-type longitudinally coupled resonator-type surface acoustic wave filter unit 1008 is connected to an unbalanced terminal 1005 via surface acoustic wave resonators 1006 and 1007. Here, IDTs connected to the unbalanced terminal 1005 include a first IDT 1009 and a third 1011. Then, a second IDT 1010 is arranged so as to be interposed between the first IDT 1009 and the third IDT 1011. One end of the second IDT 1010 is connected to the first balanced terminal 1012, and the other end thereof is connected to the second balanced terminal 1013.

The other end of the IDT 1009 connected to the unbalanced terminal 1005 is connected to an electrode pad 1015 connected to the ground potential via a ground wiring pattern 1014. Similarly, the other end of the IDT 1011, one end of which is connected to the unbalanced terminal 1005, is connected to an electrode pad 1017 connected to the ground potential through a ground wiring pattern 1016.

On the other hand, in Japanese Patent No. 3918102, an acoustic wave filter device is disclosed in which a first 3-IDT-type longitudinally coupled resonator-type acoustic wave filter unit is connected between an unbalanced terminal and a first balanced terminal, and a second 3-IDT-type longitudinally coupled resonator-type acoustic wave filter unit is connected between an unbalanced terminal and a second balanced terminal, thereby realizing a balance-unbalance conversion function. Here, it is described that by designing ground wiring, the amount of out-of-band attenuation can be reduced.

In the surface acoustic wave filter device 1001 disclosed in Japanese Unexamined Patent Application Publication No. 2003-124782, as described above, by using one longitudinally coupled resonator-type acoustic wave filter unit 1008, a balance-unbalance conversion function is provided. Therefore, not only can a balun be omitted, but an electrode configuration achieving a balance-unbalance conversion function can also be simplified. However, in the surface acoustic wave filter device 1001 disclosed in Japanese Unexamined Patent Application Publication No. 2003-124782, there is a problem in that the amount of attenuation outside the passband is insufficient.

On the other hand, in Japanese Patent No. 3918102, a configuration is shown in which by designing ground wiring, a lower loss is achieved. However, in Japanese Patent No. 3918102, the configuration in which, by designing ground wiring, the amount of out-of-band attenuation is reduced, is effective only for a filter device having the specific electrode configuration disclosed in Japanese Patent No. 3918102.

SUMMARY OF THE INVENTION

To overcome the problems described above, preferred embodiments of the present invention provide an acoustic wave filter device in which a longitudinally coupled resonator-type acoustic wave filter unit including an IDT connected to an unbalanced terminal and an IDT connected to a balanced terminal is connected between an unbalanced terminal and first and second balanced terminals and which is capable of increasing the amount of out-of-band attenuation.

According to a preferred embodiment of the present invention, an acoustic wave filter device includes an unbalanced terminal and first and second balanced terminals and that has a balance-unbalance conversion function, the acoustic wave filter device including a piezoelectric substrate, a longitudinally coupled resonator-type acoustic wave filter unit including at least three IDTs, the longitudinally coupled resonator-type acoustic wave filter unit provided on the piezoelectric substrate and being connected between the unbalanced terminal and the first and second balanced terminals, a first ground wiring provided on the piezoelectric substrate and including a first end portion and a second end portion, the first end portion being connected to a ground-side end portion of an IDT connected to the first or second balanced terminal among the at least three IDTs, a second ground wiring provided on the piezoelectric substrate and including a first end portion and a second end portion, the first end portion being connected to a ground-side end portion of the IDT connected to the unbalanced terminal, and first and second grounding electrode pads provided on the piezoelectric substrate, second end portions of the first and second ground wirings being electrically connected to the first and second grounding electrode pads, respectively, wherein the second ground wiring is arranged to branch into first and second branched wiring portions in the middle portion from the first end portion toward the second end portion, and the first and second branched wiring portions are arranged so as to sandwich an area in which the at least three IDTs are provided.

In another preferred embodiment of the acoustic wave filter device according to the present invention, first and second grounding electrode pads are preferably defined by one electrode pad. In this case, the electrode configuration on the piezoelectric substrate can be simplified, and the size of the acoustic wave filter device can be decreased.

In another preferred embodiment of the acoustic wave filter device according to the present invention, the first ground wiring preferably includes a portion in which the first ground wiring is laminated with a portion of the first branched wiring portion with an insulating film therebetween. In this case, since the first branched wiring portion and the first ground wiring are laminated with each other, it is possible to decrease the area in which the electrode configuration including the wiring is provided on the piezoelectric substrate, and the size of the acoustic wave filter device can be further decreased.

The acoustic wave filter device according to preferred embodiments of the present invention may be a boundary acoustic wave filter device and may also be a surface acoustic wave filter device. With a boundary acoustic wave filter device, a dielectric laminated on the piezoelectric substrate is further included, and the at least three IDTs are disposed between the piezoelectric substrate and the dielectric.

In a configuration in which a longitudinally coupled resonator-type acoustic wave filter unit including an IDT connected to an unbalanced terminal and IDTs on the balanced side connected to the first and second balanced terminals is connected between the unbalanced terminal and the first and second balanced terminals, a second ground wiring connected to the ground-side end portion of the IDT connected to the unbalanced terminal includes the first and second branched wiring portions and is arranged such that the first and second branched wiring portions sandwich an area in which at least three IDTs are provided. As a consequence, differential characteristics between the first and second balanced terminals are improved. Therefore, it is possible to increase the amount of attenuation outside the passband, and it is possible to decrease the loss of the acoustic wave filter device.

Other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings.

Figure 1:
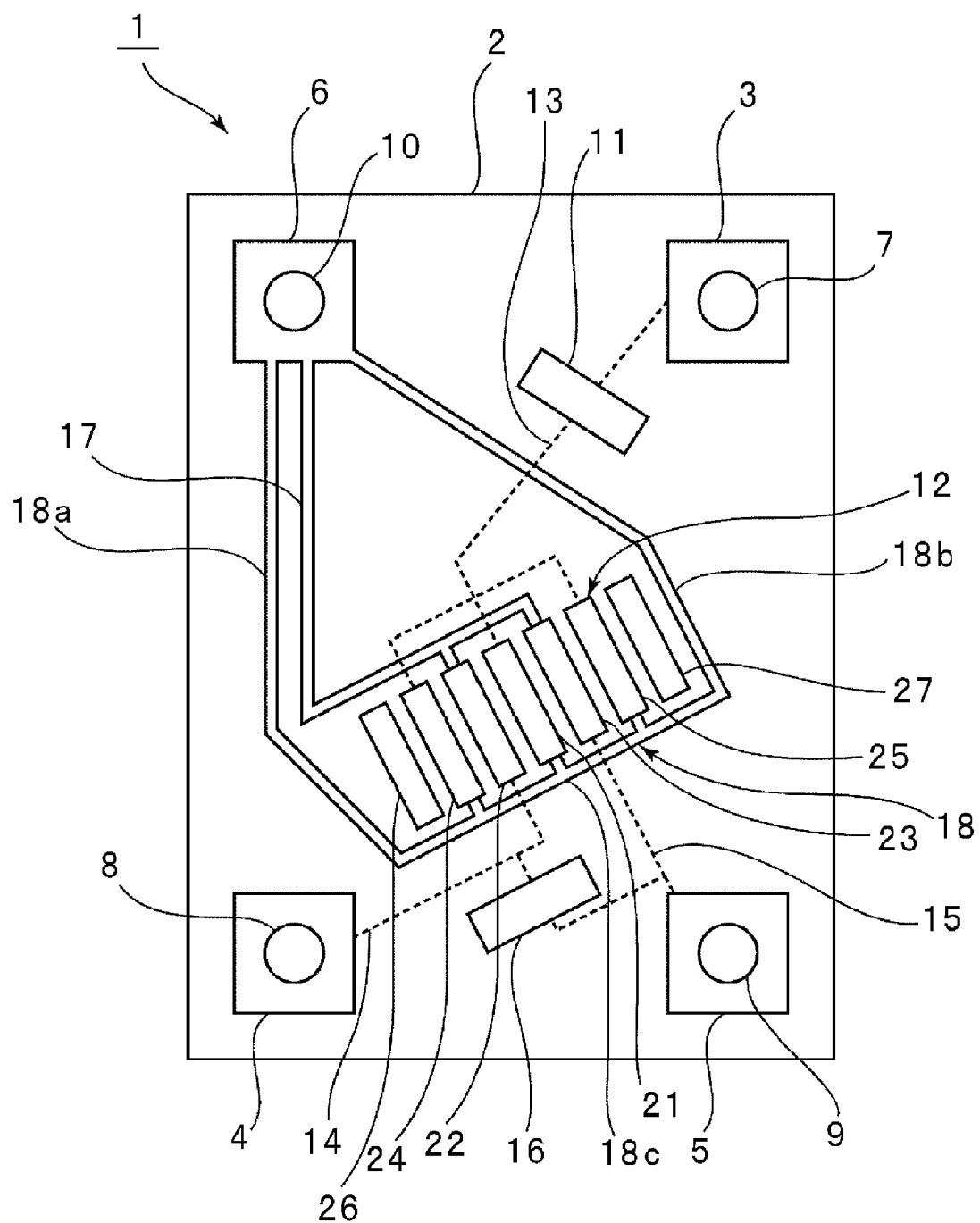
FIG. 1 is a schematic plan view showing a boundary acoustic wave filter device according to a first preferred embodiment of the present invention.

FIG. 1 is a schematic plan view showing a boundary acoustic wave filter device according to a first preferred embodiment of the present invention. In a boundary acoustic wave filter device 1, electrodes that are schematically shown in FIG. 1 are provided on a piezoelectric substrate 2. In the boundary acoustic wave filter device 1, an unbalanced terminal 3, first and second balanced terminals 4 and 5, and a ground terminal 6 are provided on the piezoelectric substrate 2. These terminals are defined by electrode pads, and bumps 7 to 10 are joined on each electrode pad, as indicated by circles. The specific configuration of these terminals and the bumps will be described below.

A 5-IDT-type longitudinally coupled resonator-type boundary acoustic wave filter unit 12 is connected to the unbalanced terminal 3 with a one-port-type boundary acoustic wave resonator 11 therebetween.

Figure 2:
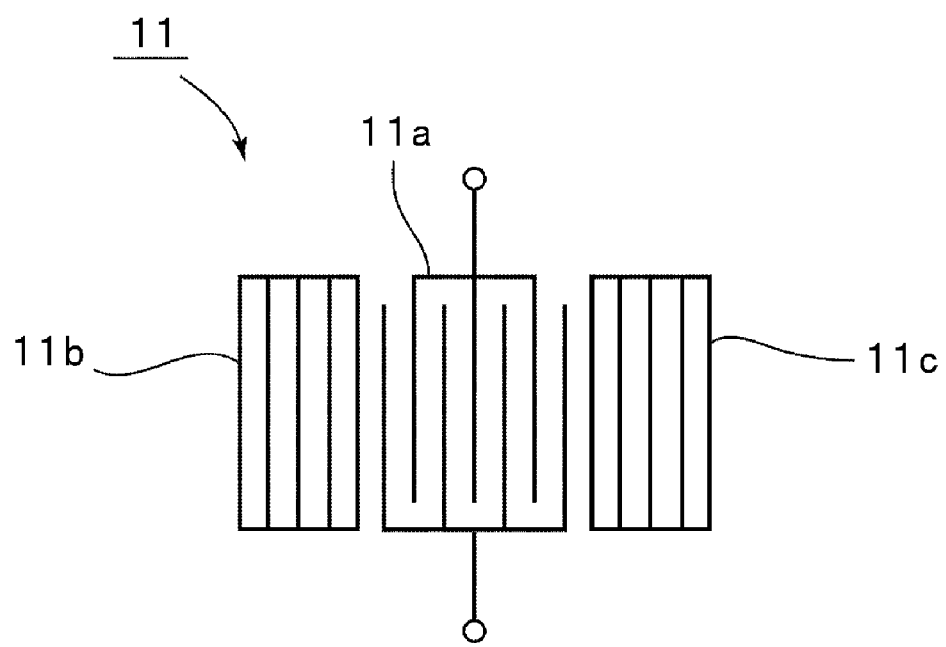
FIG. 2 is a plan view schematically showing the electrode configuration of a one-port-type boundary acoustic wave resonator used in the boundary acoustic wave filter device of the first preferred embodiment of the present invention.

In FIG. 1, the position of the one-port-type boundary acoustic wave resonator 11 is shown as a rectangular block, and the electrode configuration thereof is as shown in FIG. 2. That is, the one-port-type boundary acoustic wave resonator 11 includes an IDT 11a, and reflectors 11b and 11c arranged on both sides of the IDT 11a.

Figure 3:
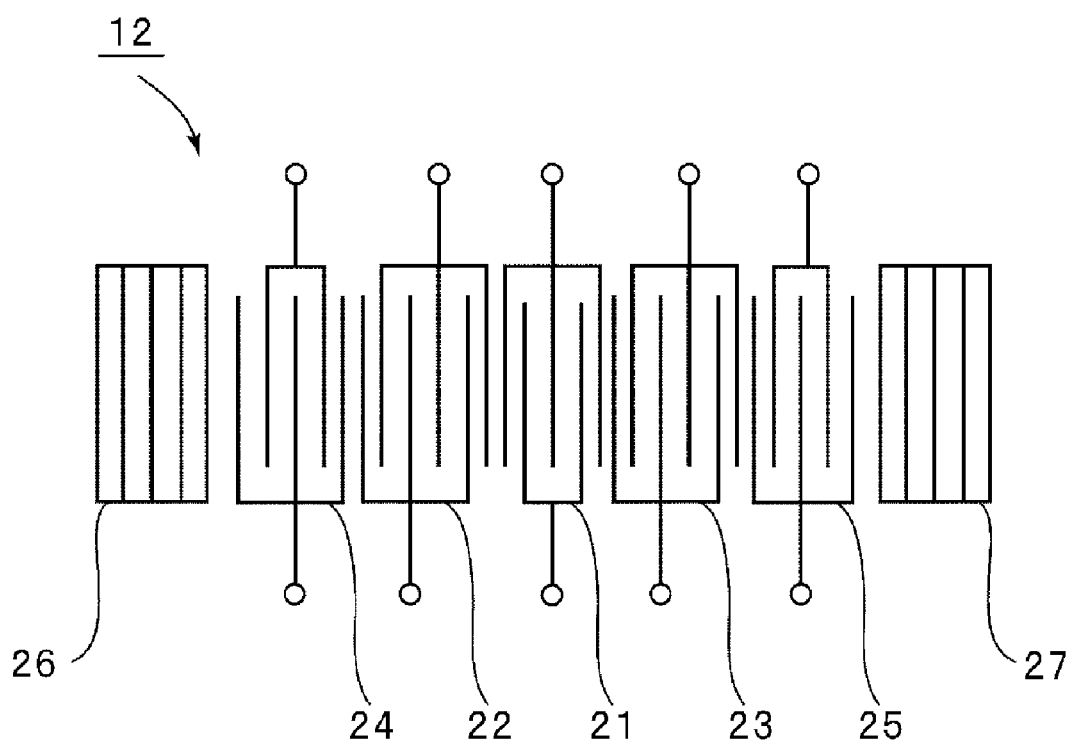
FIG. 3 is a plan view schematically showing the electrode configuration of a 5-IDT-type longitudinally coupled resonator-type boundary acoustic wave filter unit used in the boundary acoustic wave filter device of the first preferred embodiment of the present invention.

The 5-IDT-type longitudinally coupled resonator-type boundary acoustic wave filter unit 12, as shown as a rectangular block, includes a first IDT 21 arranged in the center, a second IDT 22 and a third IDT 23 that are arranged on either side of the first IDT 21 in the boundary acoustic wave propagation direction, a fourth IDT 24 and a fifth IDT 25 that are arranged on either side of the area in which the first to third IDTs 21 to 23 are arranged in the boundary wave propagation direction, and reflectors 26 and 27 arranged on either side of the area in which IDTs 21 to 25 are arranged in the boundary wave propagation direction. In FIG. 1, the electrodes are shown as rectangular blocks, and the details thereof are as shown in FIG. 3.

In the boundary acoustic wave filter device 1 according to the present preferred embodiment, one end of the first IDT 21, one end of the fourth IDT 24, and one end of the fifth IDT 25 are connected in common and are connected to the unbalanced terminal 3 with the one-port-type boundary acoustic wave resonator 11 therebetween. Therefore, the first IDT 21, the second IDT 24, and the fifth IDT 25 are IDTs on the unbalanced side. Here, a wiring pattern indicated by a dashed line, through which the unbalanced terminal 3 is connected to the common connection point of the IDTs 21, 24, and 25, is an unbalanced-side signal wiring 13.

On the other hand, one end of the second IDT 22 is connected to the first balanced terminal 4 through a balanced-side signal wiring 14 indicated by a dashed line. Similarly, one end of the third IDT 23 is electrically connected to the second balanced terminal 5 through a second balanced-side signal wiring 15 indicated by a dashed line. Then, a one-port-type boundary acoustic wave resonator 16 is connected between the first and second balanced-side signal wirings 14 and 15. The one-port-type boundary acoustic wave resonator 16 preferably has the same or substantially the same electrode configuration as the one-port-type boundary acoustic wave resonator 11.

On the other hand, the end portions of the second and thirds IDT 22 and 23 that are connected to the first and second balanced terminals 4 and 5, which are connected to the ground potential, respectively, are connected in common through a first ground wiring 17 and are also connected to the ground terminal 6. That is, the first end portion of the first ground wiring 17 is connected to the ground-side end portions of the IDTs 22 and 23, and the second end portion is connected to the ground terminal 6.

On the other hand, in the present preferred embodiment, the ground-side end portions of the IDTs 21, 24, and 25, which are the IDTs on the unbalanced side, are connected in common and are connected to the second ground wiring 18.

In the present preferred embodiment, a second ground wiring 18 includes first and second branched wiring portions 18a and 18b, and the first and second branched wiring portions 18a and 18b are arranged so as to sandwich the area in which the IDTs 21 to 25 are provided and so as to be provided on either side of the area and are also electrically connected to the same ground terminal 6.

More specifically, the second ground wiring 18 is connected to the IDTs 21, 24, and 25 on the first end portion side, and branches to the first branched wiring portion 18a and the second branched wiring portion 18b from the first end portion side toward the second end portion on the opposite side.

In order to clearly define the first and second branched wiring portions 18a and 18b, the ground wiring portion that commonly connects the ground-side end portions of the first IDT 21, the fourth IDT 24, and the fifth IDT 25 is denoted as a common ground wiring portion 18c. The common ground wiring portion 18c includes the first end portion of the second ground wiring 18 and refers to the portion from the portion that is connected to the ground-side end portion of the fourth IDT 24 up to the portion connected to the ground-side end portion of the fifth IDT 25. Therefore, the first branched wiring portion 18a is arranged to extend from one end of the common ground wiring portion 18c to outside the portion in which the reflector 26 is provided, and extends to the ground terminal 6. On the other hand, the second branched wiring portion 18b is arranged to extend from the other end of the common ground wiring portion 18c to outside the portion in which the reflector 27 is provided and extends to the ground terminal 6. Then, the end portions of the first and second branched wiring portions 18a and 18b, that is, the second end portion of the second ground wiring 18, is connected to the ground terminal 6.

In the present preferred embodiment, since the second ground wiring 18 is configured in the manner described above, it is possible to increase the amount of out-of-band attenuation.

Figure 4:
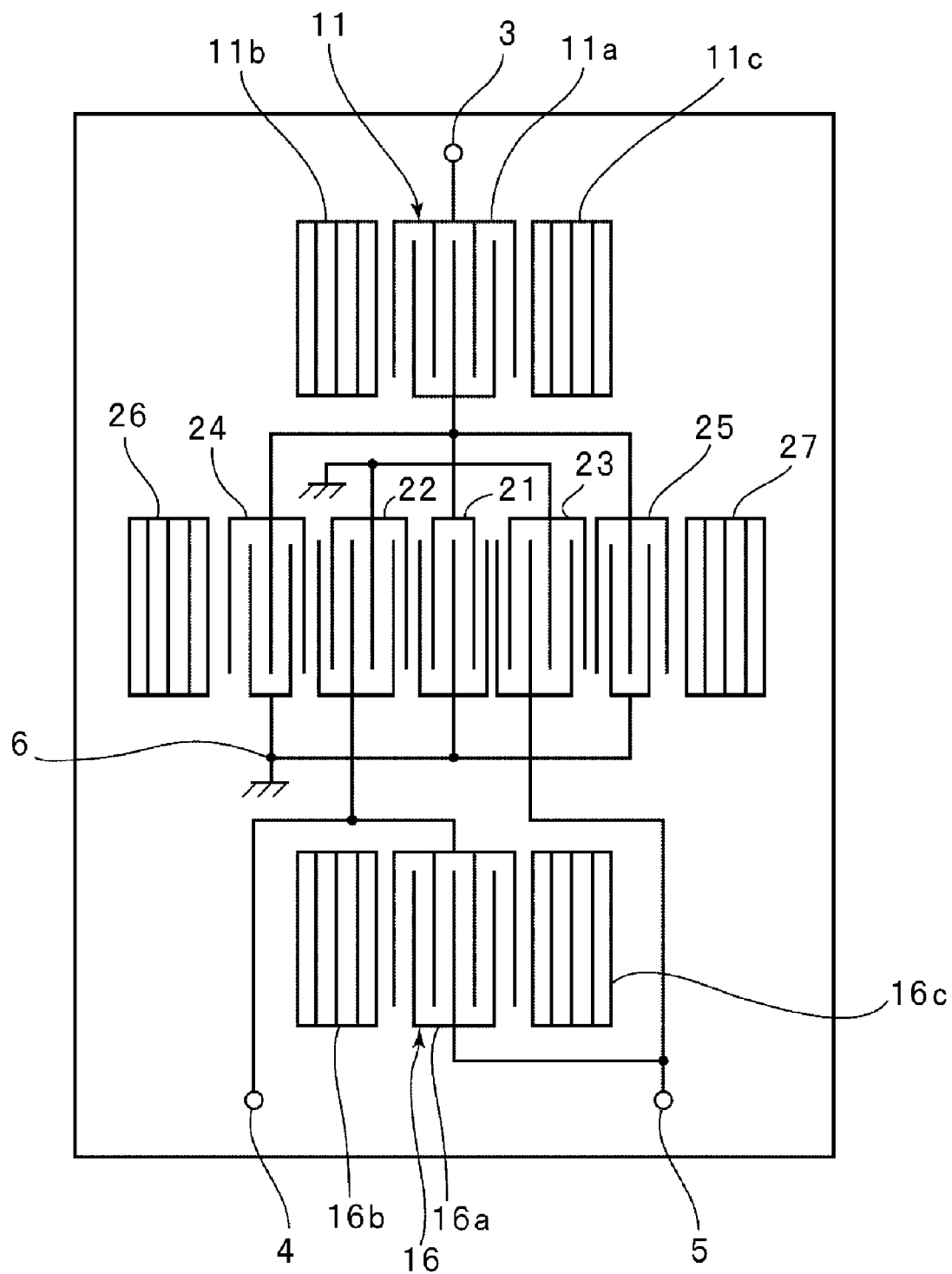
FIG. 4 is a schematic plan view showing the circuit configuration of the boundary acoustic wave filter device of the first preferred embodiment of the present invention.

An electrode configuration is provided on the piezoelectric substrate 2. As a result, in the present preferred embodiment, a filter circuit shown in FIG. 4 is provided. That is, a boundary acoustic wave filter device having a balance-unbalance conversion function, to which is connected the 5-IDT-type longitudinally coupled resonator-type boundary acoustic wave filter unit 12 including IDTs connected to an unbalanced terminal between the unbalanced terminal 3 and the first and second balanced terminals 4 and 5, and first and second balanced-side IDTs that are connected to the first and second balanced terminals, respectively, is provided.

The one-port-type boundary acoustic wave resonator 11 is not necessarily required. However, by providing the boundary acoustic wave resonator 11, it is possible to increase the amount of attenuation in the vicinity of the higher frequency side of the passband. In a similar manner, the one-port-type boundary acoustic wave resonator 16 is not necessarily required. However, by providing the one-port-type boundary acoustic wave resonator 16, it is possible to increase the amount of attenuation in the vicinity of the lower frequency side of the passband, which is desirable.

The three-dimensional structure of the boundary acoustic wave filter device 1 according to the present preferred embodiment will be described with reference to FIGS. 5A and 5B.

Figure 5A:
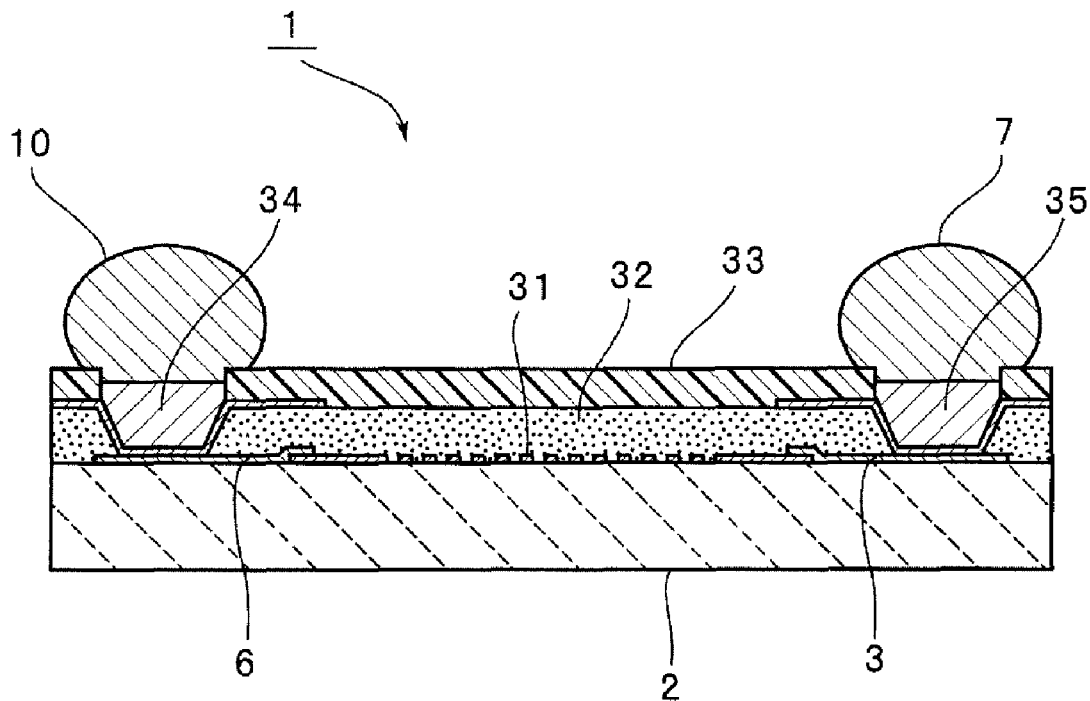
FIGS. 5A and 5B are schematic front sectional views illustrating the three-dimensional structure of the boundary acoustic wave filter device of the first preferred embodiment of the present invention and a partially cutout front sectional view showing the enlarged main portion thereof.
Figure 5B:
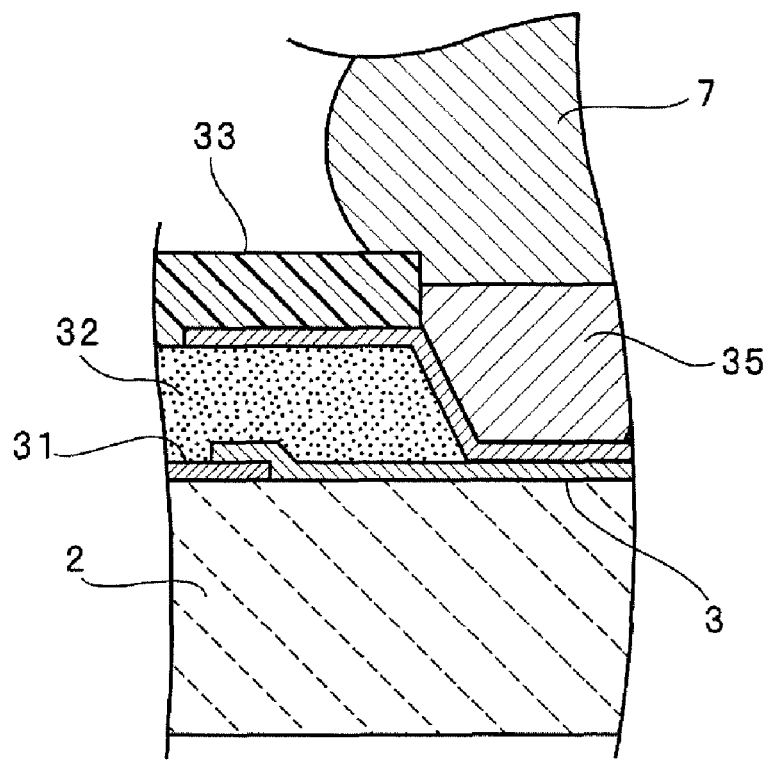

FIGS. 5A and 5B are a front sectional view schematically showing a portion of the boundary acoustic wave filter device 1, and a partially cutout front sectional view showing the enlarged main portion thereof, respectively. In the boundary acoustic wave filter device 1, an electrode 31 shown in FIG. 5A is provided on the piezoelectric substrate 2. The electrode configuration shown in FIGS. 1 and 4 is provided for the electrode 31.

In FIG. 5A, the portion in which the unbalanced terminal 3 and the ground terminal 6 are provided is schematically shown. The ground terminal 6, as shown in FIG. 5A, preferably includes a grounding electrode pad connected to an electrode 31. In a similar manner, the unbalanced terminal 3 preferably includes an electrode pad connected to the electrode 31. Then, in the boundary acoustic wave filter device 1, a dielectric 32 is laminated so as to cover the electrode 31 on the piezoelectric substrate 2. The electrodes including the IDTs 21 to 25 are arranged on the interface between the piezoelectric substrate 2 and the dielectric 32. Examples of materials forming the piezoelectric substrate 2 preferably include a piezoelectric single crystal, such as LiTaO$_3$ or LiNbO$_3$. Examples of the dielectric 32 preferably include appropriate dielectric materials, such as SiO$_2$ and SiN.

In the present preferred embodiment, a boundary acoustic wave is propagated by exciting the IDTs 21 to 25 arranged on the interface between the piezoelectric substrate 2 and the dielectric 32.

Additionally, a sound absorbing film 33 is laminated so as to cover the dielectric 32. The sound absorbing film 33 is preferably formed using an appropriate synthetic resin, glass, or insulating ceramic, for example.

Furthermore, a through hole through which the ground terminal 6 and the unbalanced terminal 3 are exposed is arranged so as to extend through the sound absorbing film 33 and the dielectric 32. Through conductors 34 and 35 are filled in the through hole. Then, the bump 10 and the bump 7, which are shown in FIG. 1, are arranged on the through conductors 34 and 35.

Examples of materials forming the bumps 10 and 7 preferably include appropriate metals, such as solder and Au, for example.

Furthermore, the electrode pads forming the electrode 31 and the terminals provided on the piezoelectric substrate 2, the ground wirings 17 and 18, and the through conductors 34 and 35 are preferably made from Al, Cu, Au, Pt, Ti, Ni, Cr, or an alloy thereof, for example. Furthermore, these electrodes and wirings may be formed by a multilayered metal film in which a plurality of metal films are laminated.

In FIG. 1, the unbalanced-side signal wiring 13, the first and second balanced-side signal wirings 14 and 15, and the like, which are indicated using dashed lines, are, in practice, defined by a conductor pattern having a desired width similar to the first and second ground wirings 17 and 18. In FIG. 1, in order to facilitate illustration and clarify the features, the signal wiring patterns 13, 14, and 15 are schematically shown using dashed lines.

Figure 6:
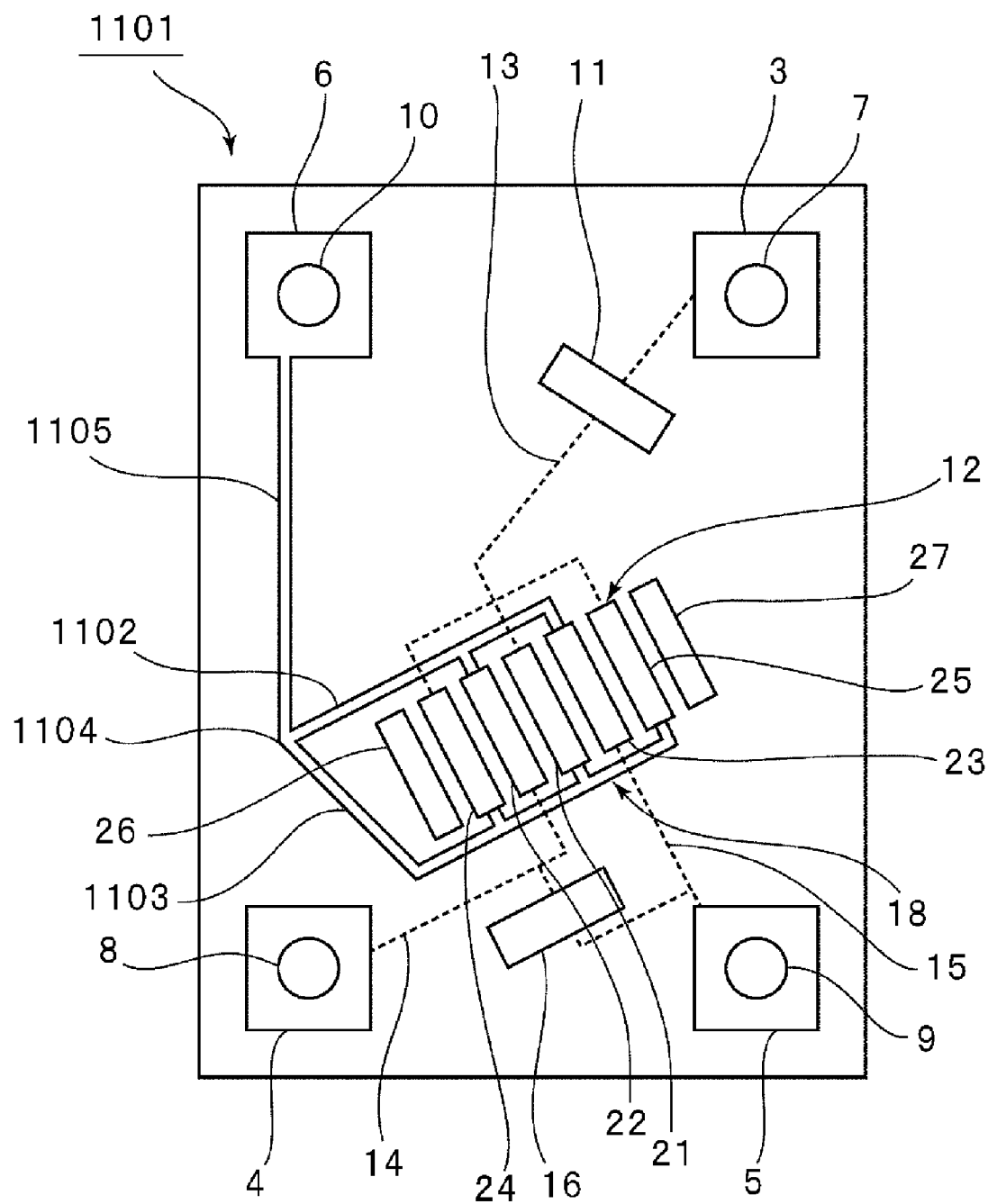
FIG. 6 is a schematic plan view illustrating a boundary acoustic wave filter device of a first comparative example, which is provided for comparison, the boundary acoustic wave filter device not yet being publicly known.
Figure 7:
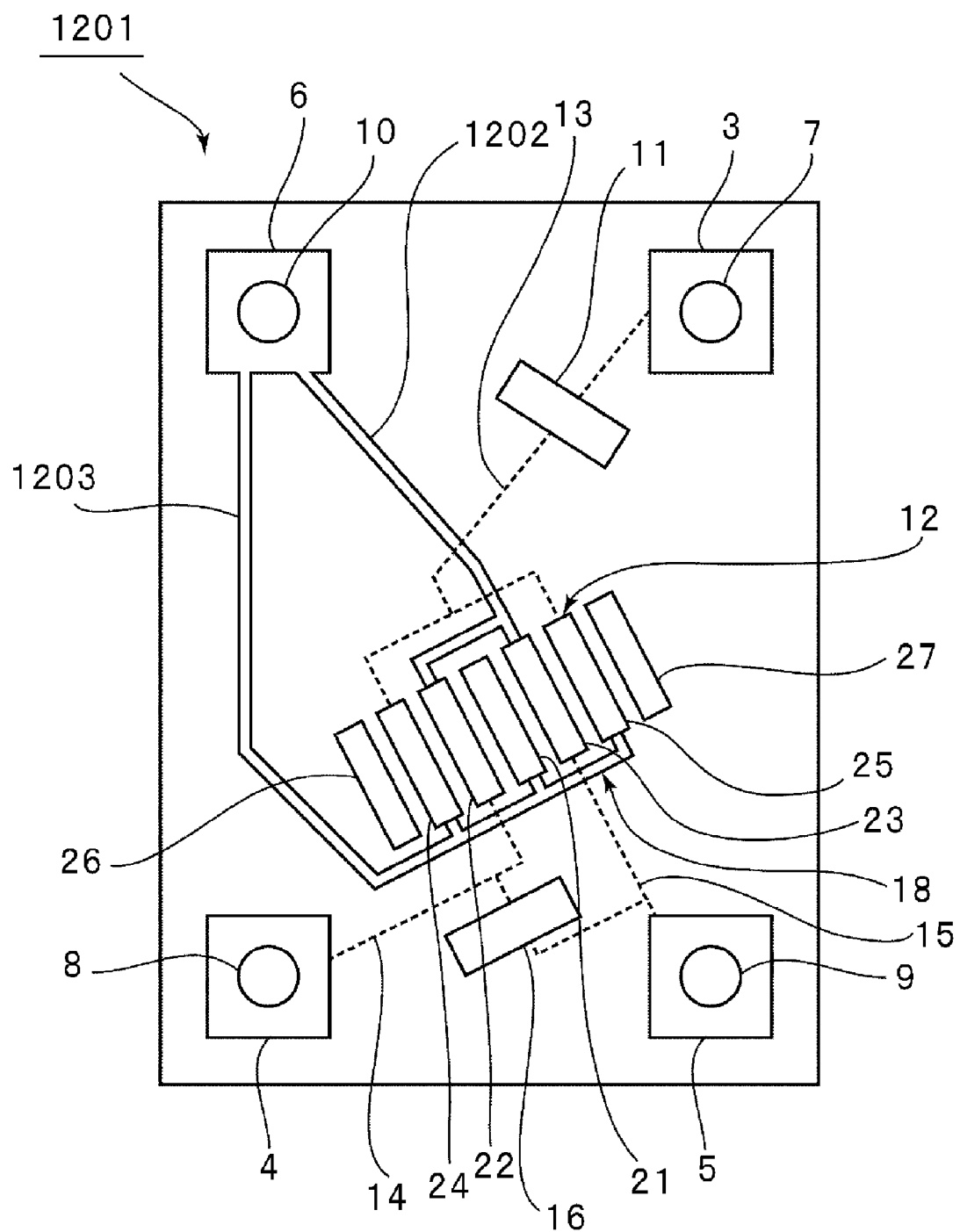
FIG. 7 is a schematic plan view illustrating a boundary acoustic wave filter device of a second comparative example, which is provided for comparison, the boundary acoustic wave filter device not yet being publicly known.

Next, the fact that since the second ground wiring 18 is configured as described above, in the boundary acoustic wave filter device 1 of the first preferred embodiment, the amount of out-of-band attenuation can be increased is described by contrasting the boundary acoustic wave filter device 1 with the boundary acoustic wave filter devices 1101 and 1201 of the comparative example, which are shown in FIGS. 6 and 7, the boundary acoustic wave filter devices 1101 and 1201 not yet being publicly known.

In the following experimental example, a preferred configuration of the boundary acoustic wave filter unit 12 and a preferred configuration of the one-port-type boundary acoustic wave resonators 11 and 16 are as follows.

Configuration of the Boundary Acoustic Wave Filter Unit 12

The number of pairs of electrode fingers was set to 17/12.5/11.5/12.5/17 in order of the fourth IDT 24/second IDT 22/first IDT 21/third IDT 23/fifth IDT 25. The electrode finger cross width in each of the IDTs 21 to 25 was set to about 100 μm, and the duty ratio (the arrangement period of the electrode finger width/electrode finger) was set to about 0.6, for example.

Furthermore, in the one-port-type boundary acoustic wave resonator 11, the number of pairs of the electrode fingers was set to 55, the electrode finger cross width was set to about 100 μm, and the duty ratio was set to about 0.6, for example.

In the one-port-type boundary acoustic wave resonator 16, the number of pairs of the electrode fingers was set to 20, the electrode finger cross width was set to about 50 μm, and the duty ratio was set to about 0.6, for example.

For the electrode material of the filter unit and the resonator, a multilayered metal film in which Ti/Pt/Au/Pt/T/NiCr were laminated in this order from the piezoelectric substrate 2 upward was used. The film thicknesses were set to about 10/10/150/10/10/17 (units: nm) in sequence, for example.

Furthermore, with regard to the sound absorbing film 33, a polyimide film of about 7 μm was formed, for example.

Furthermore, for the electrode pad portion of the ground terminal 6, a multilayered metal film in which an AlCu layer of about 1600 nm was laminated on a Ti layer having a thickness of about 40 nm was used. The thickness of the dielectric 32 made of SiO$_2$ was set to about 6 μm, for example.

Furthermore, with regard to the ground wirings 17 and 18, signal wiring, and other wiring patterns, a multilayered metal film in which Ti/AlCu/Ti/Pt were laminated in this order from the piezoelectric substrate 2 side toward the upper layers was used. The film thicknesses were set to about 20/1000/50/100 (units: nm) in the above-mentioned order. A Ti layer of about 40 nm and an AlCu layer of about 1600 nm were further laminated on the signal wiring so as to decrease electrical resistance, for example.

FIG. 6 is a schematic plan view showing the electrode configuration of a boundary acoustic wave filter device 1101 of a first comparative example.

The boundary acoustic wave filter device 1101 of the first comparative example is substantially the same as the boundary acoustic wave filter device 1 of the above-described preferred embodiment except that the ground wiring of the longitudinally coupled resonator-type boundary acoustic wave filter unit 12 is different. That is, as shown in FIG. 6, the end portions of the second IDT 22 and the third IDT 23, which are IDTs on the balanced side, the end portions being connected in common, are connected to the ground potential, and a first ground wiring 1102 is provided. Furthermore, the end portions of the first IDT 21, the fourth IDT 24, and the fifth IDT 25 on the unbalanced side, the end portions being connected to the ground potential, are connected in common, and are connected to a second ground wiring 1103. Here, the first ground wiring 1102 and the second ground wiring 1103 are connected in common at a connection point 1104, and are connected to the ground terminal 6 through a common ground wiring 1105. That is, all of the end portions of the first IDT 21 to the fifth IDT 25 on the side connected to the ground potential are connected in common at the connection point 1104, and are connected to the ground terminal 6 through the common ground wiring 1105.

As shown in FIG. 6, by sharing the ground wiring, size reduction can be achieved. However, in the boundary acoustic wave filter device 1101, the amount of out-of-band attenuation was not sufficient.

On the other hand, in a boundary acoustic wave filter device 1201 shown in FIG. 7, a first ground wiring 1202 through which the IDTs on the balanced side are connected to the ground terminal 6 is separated from a second ground wiring 1203 through which the ground potentials of the first IDT 21, the fourth IDT 24, and the fifth IDT 25 on the unbalanced side are connected in common, the second ground wiring 1203 being connected to the ground terminal 6. That is, on the balanced side and on the unbalanced side, the ground wirings 1202 and 1203 are separated from each other. The remaining structure of the boundary acoustic wave filter device 1201 is the same or substantially the same as the boundary acoustic wave filter devices 1 and 1101.

Figure 8:
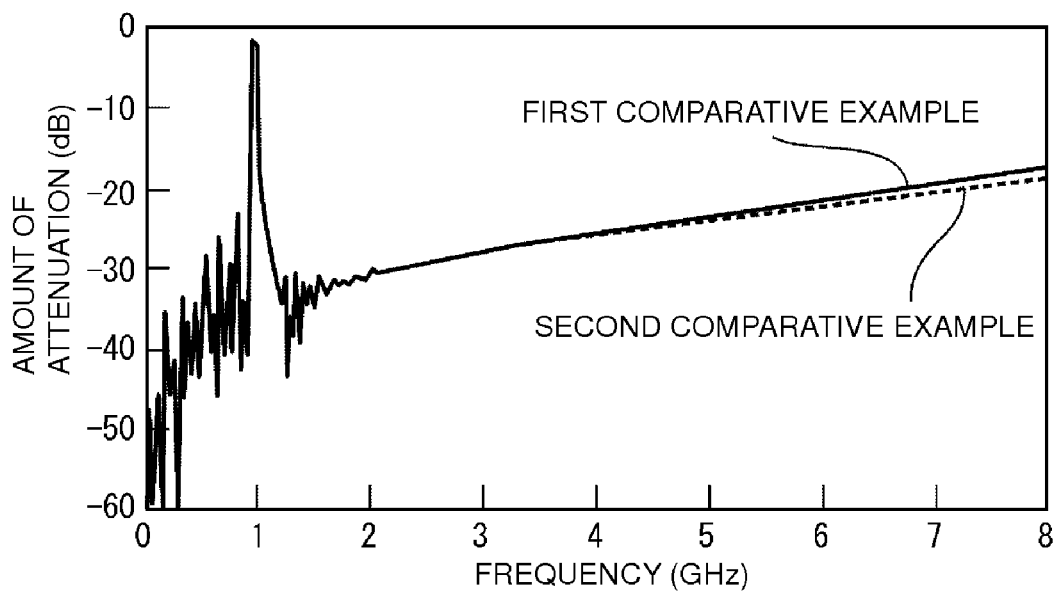
FIG. 8 shows differential characteristics between first and second balanced terminals in the boundary acoustic wave filter devices of the first and second comparative examples.
Figure 9:
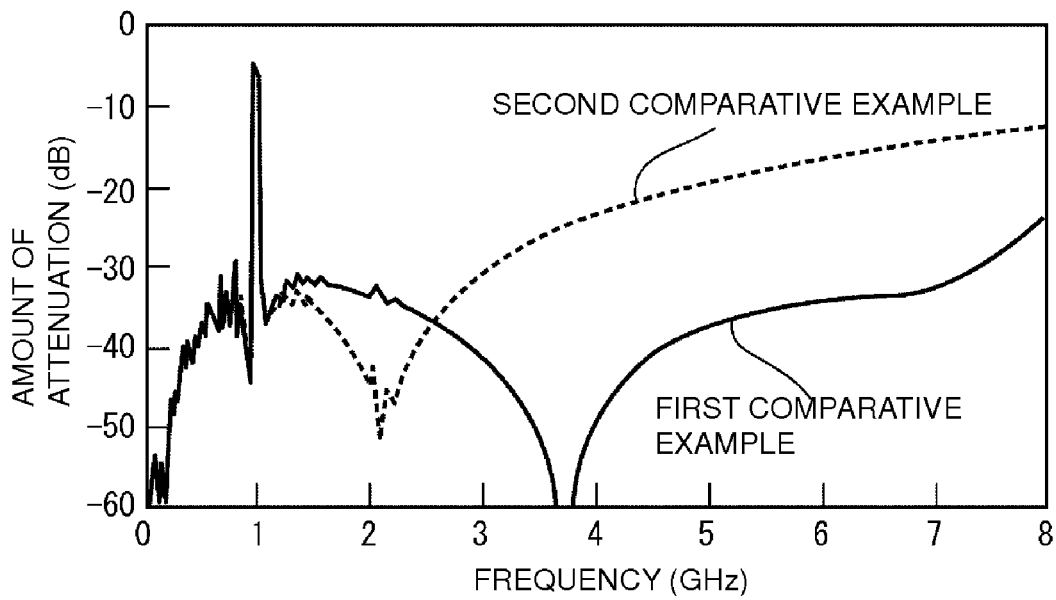
FIG. 9 shows output characteristics from the first balanced terminals in the boundary acoustic wave filter devices of the first and second comparative examples.
Figure 10:
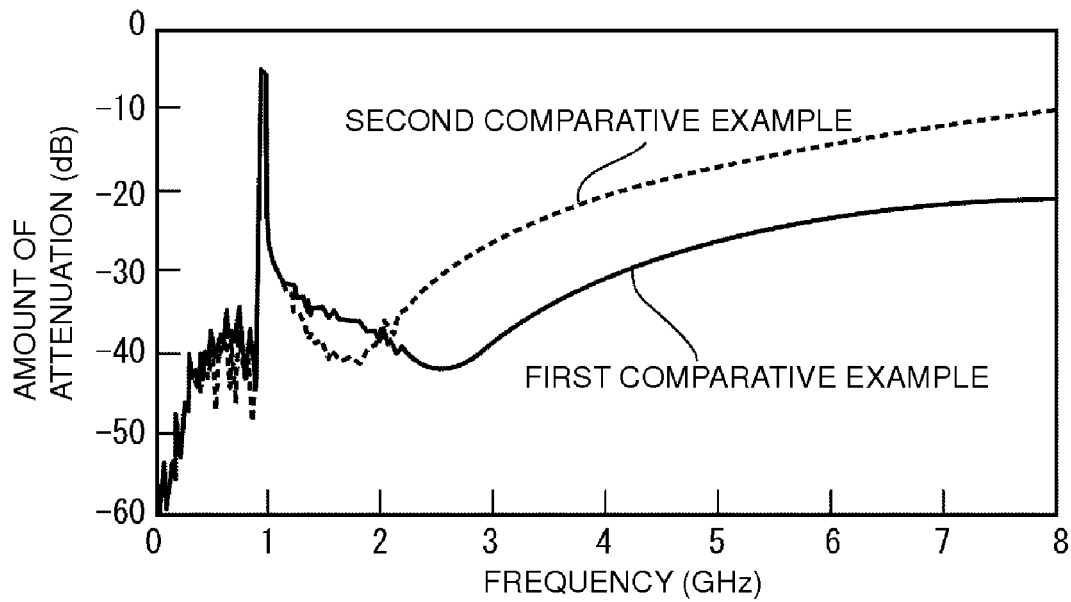
FIG. 10 shows output characteristics from the second balanced terminals in the boundary acoustic wave filter devices of the first and second comparative examples.

FIG. 8 shows differential characteristics between the first and second balanced terminals in the boundary acoustic wave filter devices of the first and second comparative examples. FIG. 9 shows output characteristics of the first balanced terminals in the boundary acoustic wave filter devices of the first and second comparative examples. FIG. 10 shows output characteristics from the second balanced terminals in the boundary acoustic wave filter devices of the first and second comparative examples. As in the boundary acoustic wave filter device 1201 of the second comparative example, it is ascertained that by separating a second ground wiring connected to the unbalanced terminal from the first ground wiring connected to the balanced terminal, the common mode level outside the band is improved. However, as shown in FIGS. 8 to 10, the amount of out-of-band attenuation is not very large regardless of whether the second ground wiring is separated or not. For example, in the vicinity of 6 GHz, the differential characteristic of the amount of attenuation is limited to about 30 dB.

Figure 11:
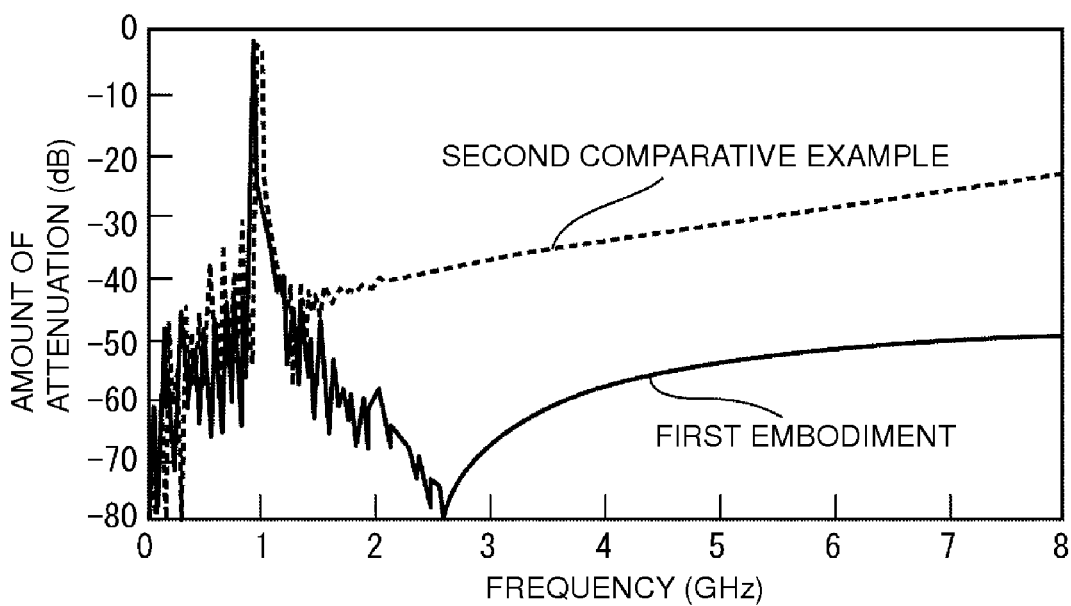
FIG. 11 shows differential characteristics between the first and second balanced terminals of the boundary acoustic wave filter devices of the first preferred embodiment of the present invention and the second comparative example.
Figure 12:
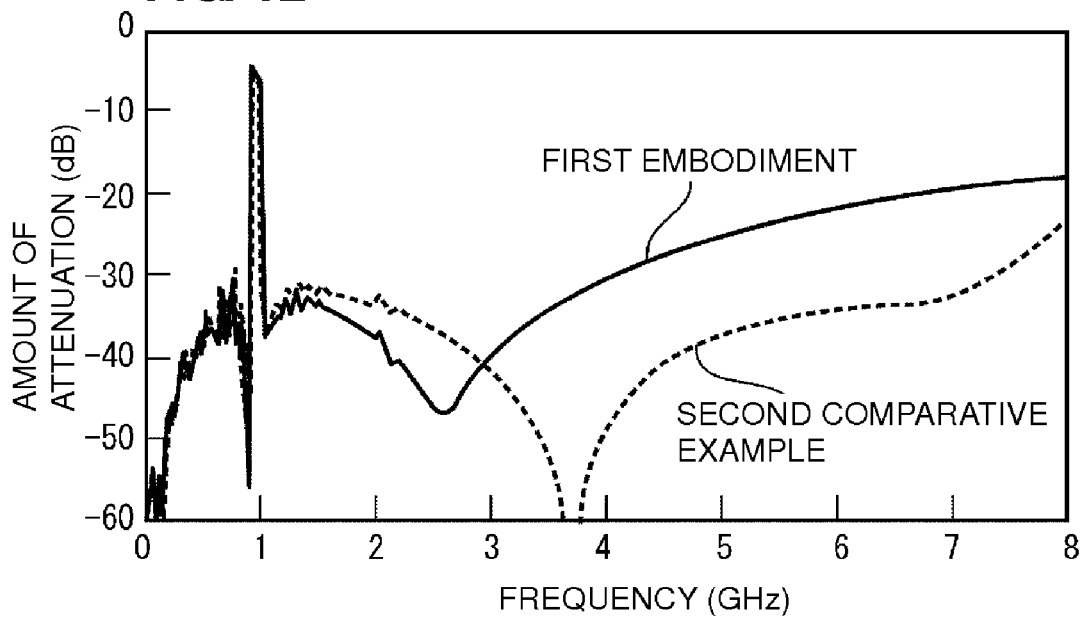
FIG. 12 shows output characteristics from the first balanced terminals in the boundary acoustic wave filter devices of the first preferred embodiment of the present invention and the second comparative example.
Figure 13:
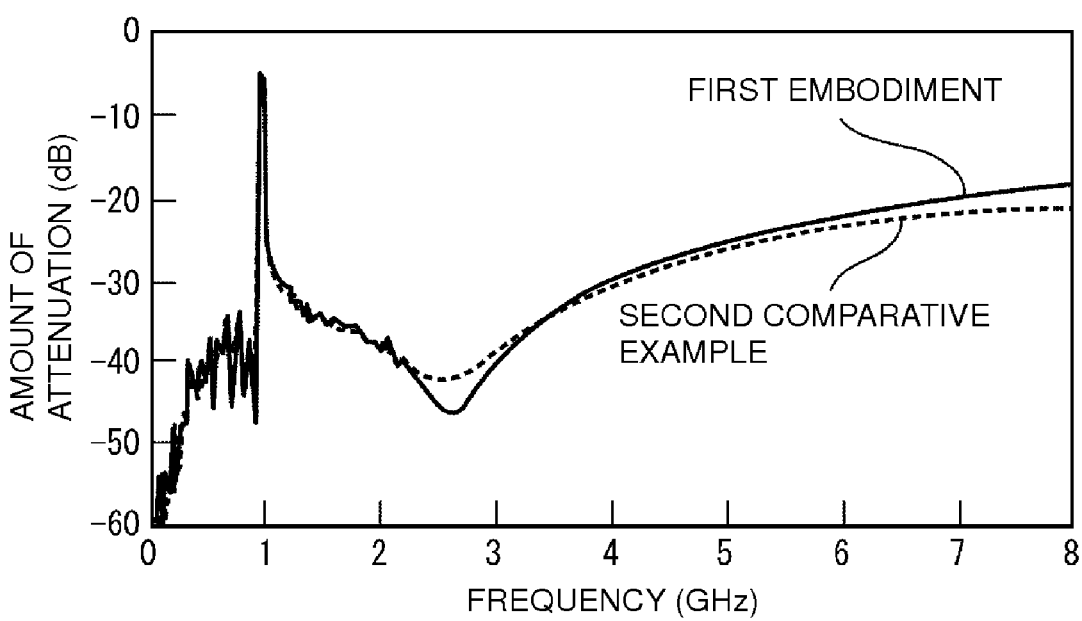
FIG. 13 shows output characteristics from the second balanced terminals in the boundary acoustic wave filter devices of the first preferred embodiment of the present invention and the second comparative example.

FIG. 11 shows differential characteristics between the first and second balanced terminals in the boundary acoustic wave filter device 1 of the first preferred embodiment of the present invention and in the boundary acoustic wave filter device 1201 of the second comparative example. FIG. 12 shows output characteristics from the first balanced terminal. FIG. 13 shows output characteristics from the second balanced terminal.

As shown in FIGS. 11 to 13, in particular, as shown from the differential characteristics shown in FIG. 11, it can be seen that in the boundary acoustic wave filter device 1 of the first preferred embodiment of the present invention, the amount of attenuation outside the passband can be greatly improved. For example, at approximately 6 GHz, it can be seen that whereas the amount of attenuation is about 30 dB in the second comparative example, in the present preferred embodiment, the amount of attenuation is about 50 dB or more, which is increased by about 20 dB or more.

That is, by providing the second ground wiring connected to the unbalanced-side IDTs 21 24, and 25 so as to have the branched wiring portions 18a and 18b, the amount of out-of-band attenuation can be greatly improved. This is attributed to the fact that since the branched wiring portions 18a and 18b are arranged so as to extend on either side of the area in which the IDTs 21 to 25 are provided, the parasitic capacitances for the ground wiring is equal or substantially equal, and thus, the differential characteristics between the first and second balanced terminals are improved. The differential characteristics are a difference between the output characteristics of the first balanced terminal and the output characteristics of the second balanced terminal. As shown in FIGS. 12 and 13, in the first preferred embodiment, the out-of-band attenuation characteristics at higher frequencies are approximately the same. For this reason, the differential characteristics have been improved. In contrast, in the second comparative example, the out-of-band attenuation characteristics at higher frequencies differ greatly. For this reason, the differential characteristics have worsened. As described above, according to the first preferred embodiment of the present invention, the amount of out-of-band attenuation can be greatly improved by only deforming the pattern of the second ground wiring.

Figure 14A:
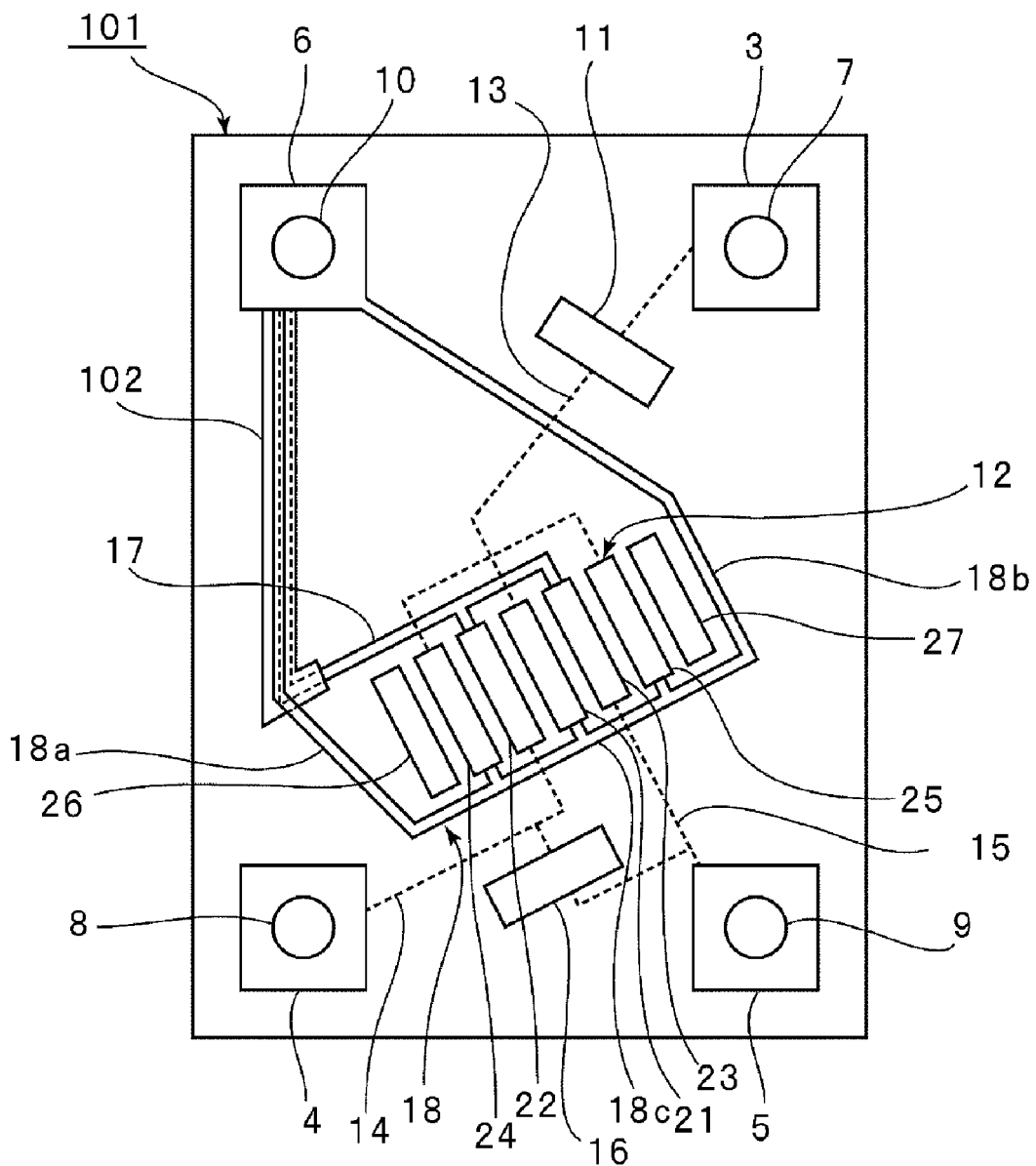
FIGS. 14A and 14B are a schematic plan view illustrating the boundary acoustic wave filter device of a second preferred embodiment of the present invention and a partially cutout sectional view showing the main portion thereof.
Figure 14B:
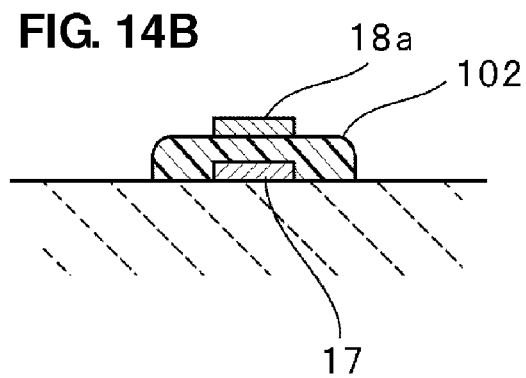

FIGS. 14A and 14B are a schematic plan view of a boundary acoustic wave filter device according to a second preferred embodiment of the present invention, and a partially cutout sectional view showing the main portion thereof.

In the boundary acoustic wave filter device 101 according to the present preferred embodiment, the first ground wiring 17 is arranged so as to overlap a portion of the second ground wiring 18. That is, a portion of the first branched wiring portion 18a of the second ground wiring 18 is laminated with the first ground wiring 17 so as to extend over the first ground wiring 17. However, an insulating layer 102 is arranged between the first ground wiring 17 and the first branched wiring portion 18a in order to achieve electrical insulation therebetween. That is, the first ground wiring 17 is arranged on the piezoelectric substrate 2, the insulating layer 102 is laminated on the first ground wiring 17, and the first branched wiring portion 18a of the second ground wiring 18 is connected to the insulating layer 102. As a result, the electrical insulation between the first ground wiring 17 and the first branched wiring portion 18a of the second ground wiring 18 is achieved. As described above, the boundary acoustic wave filter device 101 according to the present preferred embodiment is configured to be the same or substantially the same as the boundary acoustic wave filter device 1 of the first preferred embodiment except that a portion of the first branched wiring portion 18a is laminated on the first ground wiring 17 with the insulating layer 102 therebetween.

The material used for the insulating layer 102 is not particularly limited. The insulating layer 102 can be made using an appropriate synthetic resin, such as a polyimide resin, an epoxy resin, or an acryl resin, or an insulating ceramic, such as alumina, for example.

Figure 15A:
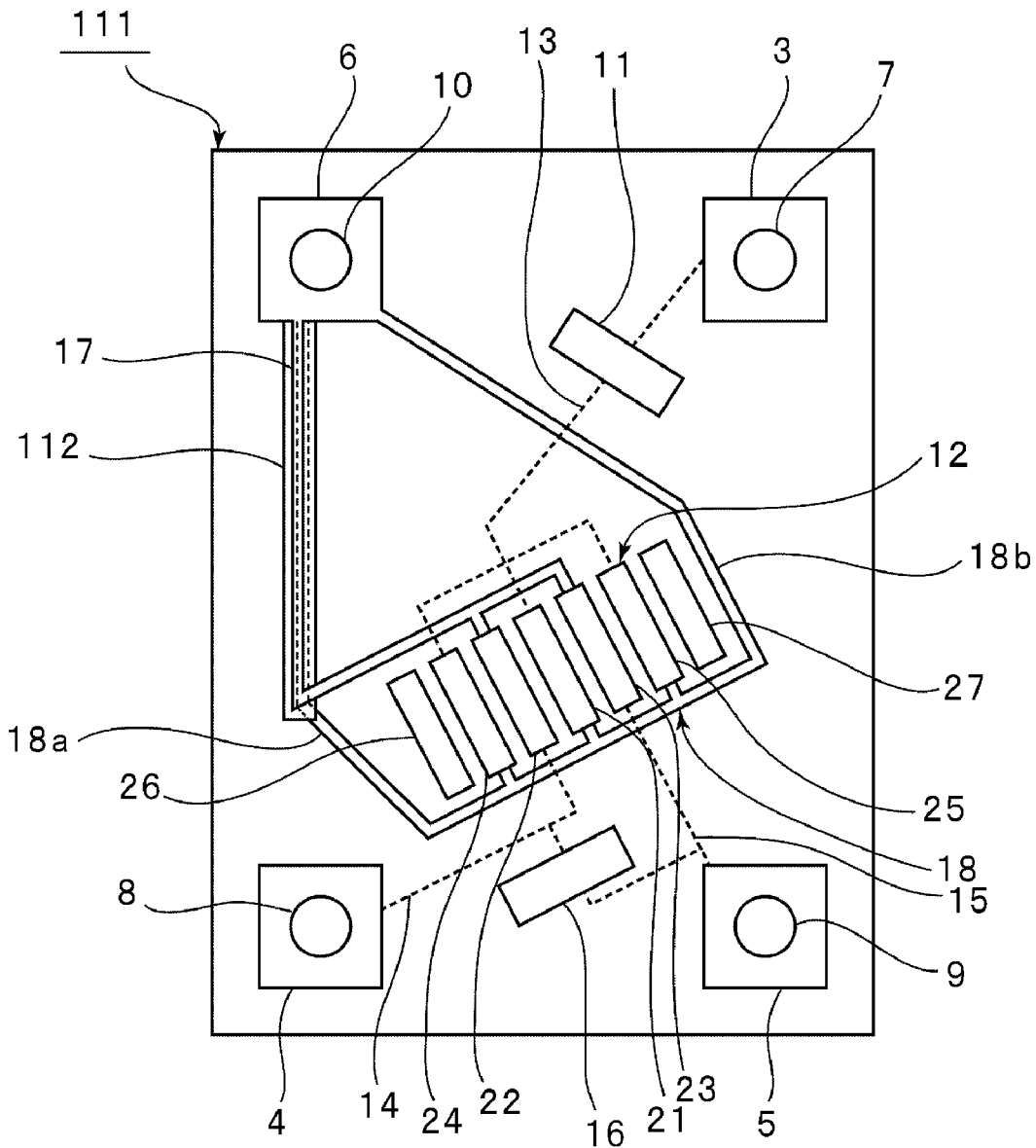
FIGS. 15A and 15B are a schematic plan view showing the electrode configuration of a boundary acoustic wave filter device according to a modification of the boundary acoustic wave filter device of the second preferred embodiment of the present invention and a partially cutout sectional view showing the main portion thereof.
Figure 15B:
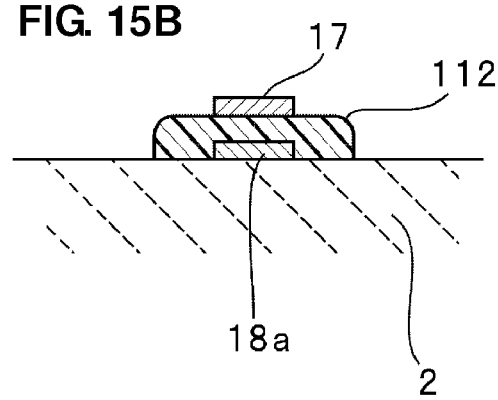

FIGS. 15A and 15B are a schematic plan view showing the boundary acoustic wave filter device 111 according to a modification of the boundary acoustic wave filter device 101 of the second preferred embodiment, and a partially cutout sectional view showing the main portion thereof. Here, in contrast to the boundary acoustic wave filter device 101 of the second preferred embodiment, the insulating layer 112 is laminated on the first branched wiring portion 18a of the second ground wiring 18, and the first ground wiring 17 is laminated on the insulating layer 112. As described above, where the first ground wiring 17 is laminated with a portion of the first branched wiring portion 18a, either of them may be positioned below the other.

In the boundary acoustic wave filter device 101 of the second preferred embodiment and the boundary acoustic wave filter device 111 of the modification, since the first ground wiring 17 is laminated with the second branched wiring portion of the second ground wiring 18, the density at which the electrode pattern is arranged can be increased, thereby furthering a decreasing the size of the boundary acoustic wave devices.

Where the first ground wiring 17 is laminated with a portion of the second ground wiring 18 with the insulating layers 102 and 112 therebetween, there is a risk that characteristics may deteriorate due to the capacitance produced between the portion of the first ground wiring 17 and the second ground wiring 18. However, in the boundary acoustic wave filter device 101 of the second preferred embodiment and the boundary acoustic wave filter device 111 of the modification, the differential characteristics can be greatly improved as compared to the boundary acoustic wave filter device 1201 of the second comparative example. This is shown in FIGS. 16 to 18.

Figure 16:
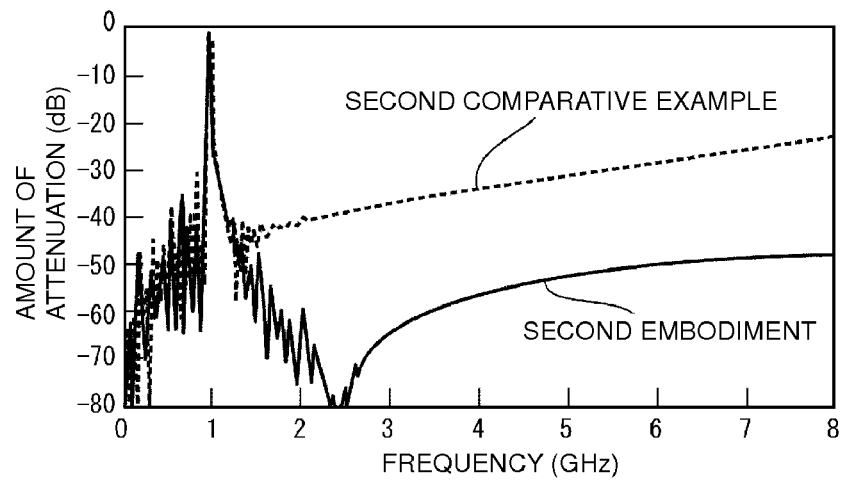
FIG. 16 shows differential characteristics between the first and second balanced terminals in the boundary acoustic wave filter devices of the second preferred embodiment of the present invention and the second comparative example.

FIG. 16 shows differential characteristics between the first and second balanced terminals in the boundary acoustic wave filter device 101 of the second preferred embodiment and the boundary acoustic wave filter device 1201 of the second comparative example. FIG. 17 shows output characteristics from the first balanced terminal. FIG. 18 shows output characteristics from the second balanced terminal. The solid line indicates a result of the second preferred embodiment, and the dashed line indicates a result of the second comparative example.

Figure 17:
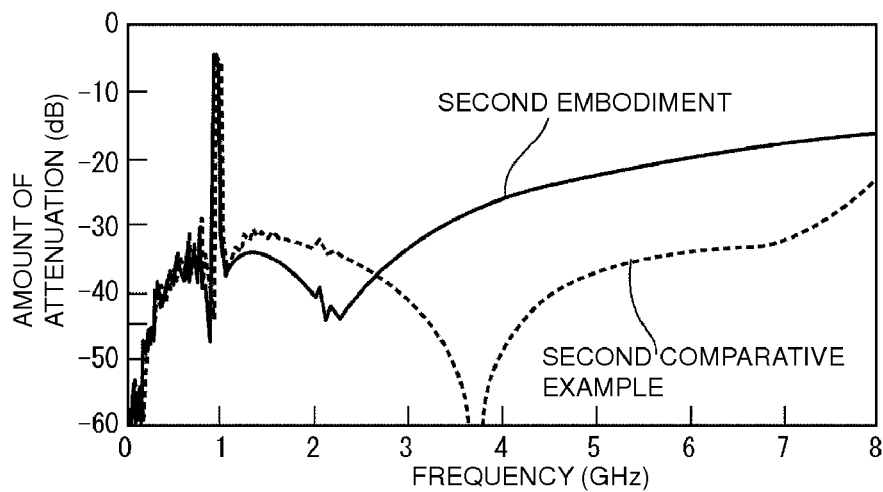
FIG. 17 shows output characteristics from the first balanced terminals in the boundary acoustic wave filter devices of the second preferred embodiment of the present invention and the second comparative example.
Figure 18:
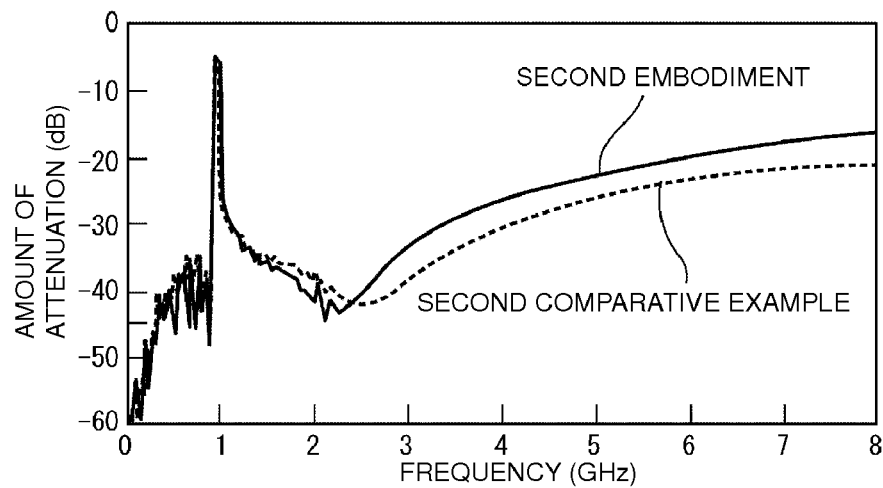
FIG. 18 shows output characteristics from the second balanced terminals in the boundary acoustic wave filter devices of the second preferred embodiment of the present invention and the second comparative example.
Figure 19:
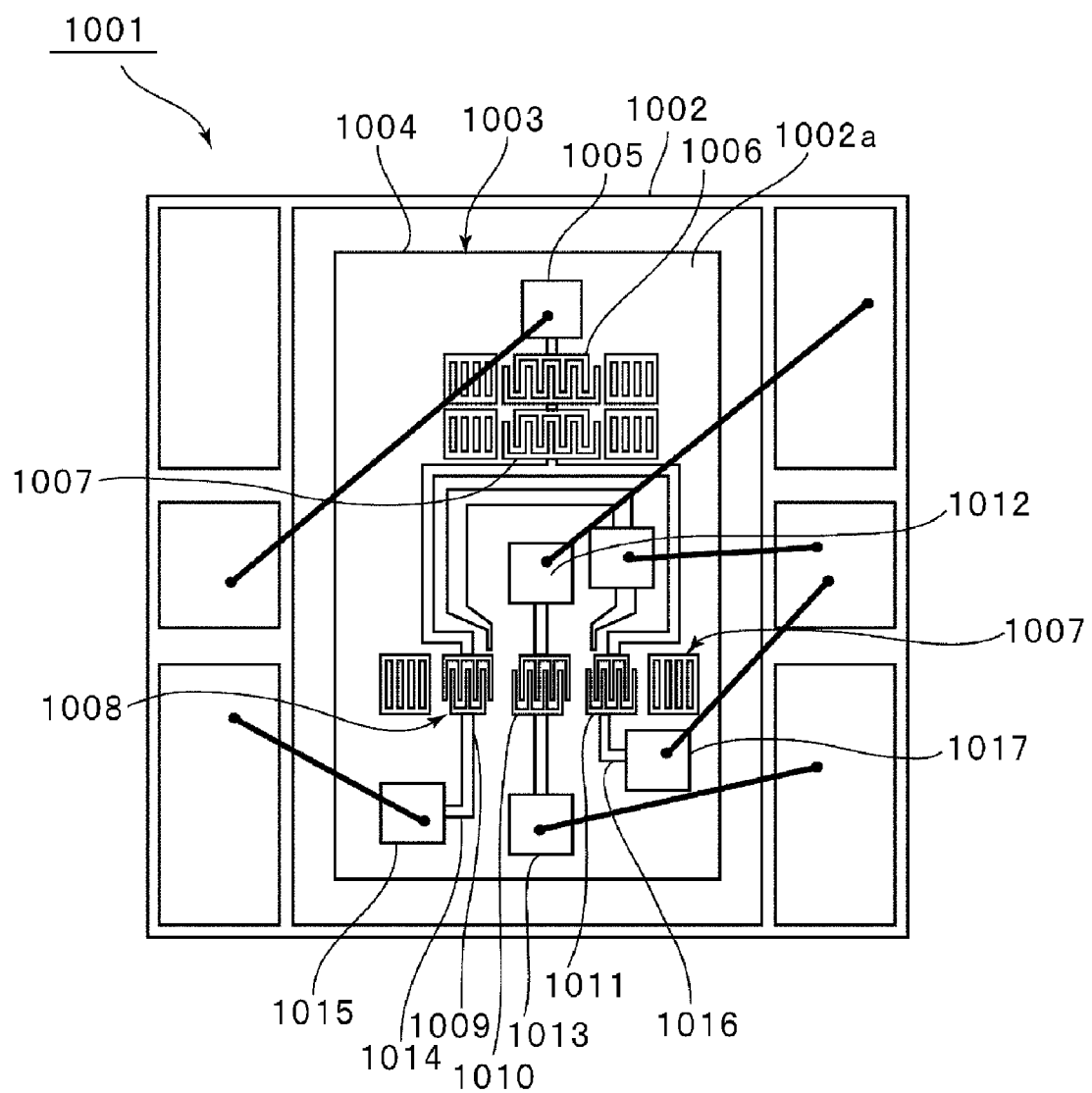
FIG. 19 is a plan view illustrating an example of a surface acoustic wave filter device of the related art.

As shown in FIGS. 16 to 18, in particular, as shown from the differential characteristics of FIG. 16, in the second preferred embodiment, it can be seen that the amount of out-of-passband attenuation can be greatly improved as compared to the second comparative example. That is, in the frequency band of 6 GHz, in the second preferred embodiment, the amount of attenuation can be improved by about 30 dB or more as compared to the second comparative example. Therefore, the amount of out-of-passband attenuation can be increased while achieving a decrease in size.

In the first and second preferred embodiments and the modifications that have been described above, a boundary acoustic wave filter device preferably has been described. In addition, preferred embodiments of the present invention can be applied to not only a boundary acoustic wave filter device, but also to a surface acoustic wave filter device using a surface acoustic wave. That is, a surface acoustic wave filter device having the same or substantially the same configuration can be provided by forming the entire electrode configuration shown in FIG. 1 on a piezoelectric substrate without forming ground wiring on a dielectric.

Therefore, it should be noted that FIG. 1 can show a piezoelectric substrate and an electrode configuration for a surface acoustic wave filter device.

Furthermore, in the boundary acoustic wave filter device 1 of the above-described preferred embodiments, five IDTs 21 to 25 preferably are provided. In addition, preferred embodiments the present invention can be widely applied to a boundary acoustic wave filter device including a longitudinally coupled resonator-type boundary acoustic wave filter unit including three or more odd-numbered IDTs.

That is, preferred embodiments of the present invention can be widely applied to an acoustic wave filter device to which a longitudinally coupled resonator-type acoustic wave filter unit including at least three IDTs so as to include an IDT connected to an unbalanced terminal and IDTs connected to first and second balanced terminals among at least three IDTs between the unbalanced terminal and the first and second balanced terminals. The acoustic wave filter device disclosed in Japanese Patent No. 3918102, in which a first longitudinally coupled resonator-type acoustic wave filter unit is connected between an unbalanced terminal and a first balanced terminal, and a second longitudinally coupled resonator-type acoustic wave filter is connected between an unbalanced terminal and a second balanced terminal is completely different in terms of the electrode configuration that provides a balance-unbalance conversion function from the acoustic wave filter device according to preferred embodiments of the present invention.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An acoustic wave filter device including an unbalanced terminal and first and second balanced terminals and having a balance-unbalance conversion function, the acoustic wave filter device comprising:
a piezoelectric substrate;
a longitudinally coupled resonator-type acoustic wave filter unit including at least three IDTs, the longitudinally coupled resonator-type acoustic wave filter unit being provided on the piezoelectric substrate and being connected between the unbalanced terminal and the first and second balanced terminals;
a first ground wiring provided on the piezoelectric substrate and including a first end portion and a second end portion, the first end portion of the first ground wiring being connected to a ground-side end portion of an IDT connected to the first or second balanced terminal among the at least three IDTs;
a second ground wiring provided on the piezoelectric substrate and including a first end portion and a second end portion, the first end portion of the second ground wiring being connected to a ground-side end portion of an IDT connected to the unbalanced terminal; and
first and second grounding electrode pads provided on the piezoelectric substrate, the second end portions of the first and second ground wirings being electrically connected to the first and second grounding electrode pads, respectively; wherein
the second ground wiring is arranged to branch to first and second branched wiring portions in a middle portion from the first end portion toward the second end portion, and the first and second branched wiring portions are arranged so as to sandwich an area in which the at least three IDTs are provided.

2. The acoustic wave filter device according to claim 1, wherein the first and second grounding electrode pads are defined by one electrode pad.

3. The acoustic wave filter device according to claim 1, wherein the first ground wiring includes a portion that is laminated with a portion of the first branched wiring portion with an insulating film therebetween.

4. The acoustic wave filter device according to claim 1, further comprising:
a dielectric laminated on the piezoelectric substrate; wherein
the acoustic wave filter device is a boundary acoustic wave filter device in which at least three IDTs are disposed between the piezoelectric substrate and the dielectric.

5. The acoustic wave filter device according to claim 1, wherein the acoustic wave filter device is a surface acoustic wave filter device.

* * * * *